United States Patent
Dokumaci et al.

(10) Patent No.: US 6,764,883 B1
(45) Date of Patent: Jul. 20, 2004

(54) AMORPHOUS AND POLYCRYSTALLINE SILICON NANOLAMINATE

(75) Inventors: Omer H. Dokumaci, Wappingers Falls, NY (US); Oleg Gluschenkov, Wappingers Falls, NY (US); Michael Belyansky, Bethel, CT (US); Bruce B. Doris, Brewster, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/338,071

(22) Filed: Jan. 7, 2003

(51) Int. Cl.[7] ................ H01L 21/00; H01L 21/425
(52) U.S. Cl. ............... 438/149; 438/479; 438/517
(58) Field of Search .................... 438/149–153, 438/479, 517; 257/347

(56) References Cited

U.S. PATENT DOCUMENTS

| | | | |
|---|---|---|---|
| 5,238,849 A | * | 8/1993 | Sato |
| 5,412,246 A | * | 5/1995 | Dobuzinsky et al. |
| 5,443,863 A | * | 8/1995 | Neely et al. |
| 5,700,699 A | * | 12/1997 | Han et al. |
| 5,738,909 A | * | 4/1998 | Thankur et al. |
| 6,165,842 A | * | 12/2000 | Shin et al. ............ 438/257 |

OTHER PUBLICATIONS

Horst Zimmerman, Integrated Silicon Optoelectronics (Springer–Verlag, 2000), pp. 145–159.*

* cited by examiner

Primary Examiner—Cuong Nguyen
(74) Attorney, Agent, or Firm—Margaret A. Pepper

(57) ABSTRACT

A method for forming a uniform layered structure comprising an ultra-thin layer of amorphous silicon and its thermal oxide is disclosed. In one aspect, a method for forming a nanolaminate of silicon oxide on a substrate is disclosed. In another aspect, a method for forming a patterned hard mask on a substrate is disclosed. The patterned hard mask includes a nanolaminate of silicon and silicon oxide. The methods are characterized by the oxidation of an amorphous silicon layer using atomic oxygen.

8 Claims, 7 Drawing Sheets

US 6,764,883 B1

AMORPHOUS AND POLYCRYSTALLINE SILICON NANOLAMINATE

FIELD OF THE INVENTION

This invention relates generally to the manufacture of high speed semiconductor microprocessors, application specific integrated circuits (ASICs), and other high speed integrated circuit devices. More particularly, this invention relates to the art of creating layered ultra-thin amorphous structures. Specifically, this invention relates to a novel method of forming a uniform layered structure comprising an ultra-thin layer of amorphous silicon and its thermal oxide. Useful embodiments include a method of fabricating hard mask and a method of fabricating thin polycrystalline layer of silicon-on-insulator.

BACKGROUND OF THE INVENTION

Ultra thin layers of semiconductors are employed in a variety of electronic devices. For instance, various quantum well and superlattice structures have found applications in High Electron Mobility Transistors (HEMTs), laser diodes, light emitting diodes, and photodetectors. Such structures include ultra thin layers (less than 200 Å) of a crystalline semiconductor. The structures are fabricated with the well known lattice matching and epitaxial techniques.

Metal-Insulator-Semiconductor (MIS) structures are used in most logic, memory, and display circuits due to the low power consumption of MISFETs and the existence of mature process technology. The performance of MISFETs can be improved if they are formed on a Semiconductor-on-Isolator (SOI) substrate. If the semiconductor layer of the SOI substrate is thinned to below 100 Å, the performance of the short-channel MISFETs can be improved even further. Clearly, the insulator-semiconductor-insulator structure with an ultra thin layer of semiconductor is highly desirable.

Amorphous and polycrystalline semiconductors are employed in Thin Film Transistors (TFTs). At the moment, TFTs are used in various display panels. TFTs also may be employed in three dimensional (3D) integrated circuits where the active devices are stacked on top of each other.

One possible way to increase performance of TFT is similar to that of the crystalline MISFET: thinning down its channel to below 100 Å. However, no process is known that can produce a uniform ultra thin layer of amorphous or polycrystalline semiconductor on insulator. Due to a different lattice structure, the deposition of a polycrystalline film onto an amorphous film proceeds through an island growth at the beginning of the process. For instance, in order to form a continuous film of polycrystalline silicon, one must deposit at least 150–200 Å. Deposition of an amorphous silicon film may improve the situation somewhat but still limits the thickness of a uniform thin film to above 100–150 Å.

Thus, there is a need in the art for a method of forming uniform ultra thin layers of amorphous and polycrystalline silicon and related layered structures.

Since its invention in 1960 the thermal oxidation of silicon is considered to be the enabling process for modern integrated circuits. After over more than four decades of extensive investigation there is a vast art on various aspects of the thermal oxidation and its applications to the fabrication of integrated circuits and other microstructures. There are several key properties of thermal oxidation that distinguish it from other methods of forming dielectric on semiconductor. These properties are: (1) a nearly electrically perfect interface between silicon and silicon oxide, (2) high dielectric strength of the oxide, and (3) excellent control of the uniformity of the oxide film. Due to these properties the thermal oxide has been used as the gate dielectric, the isolator in various LOCOS (local isolation of silicon) structures, the isolator for various IT (isolation trench) structures, the gate sidewall isolator/spacer, the screen oxide for ion implantation, etc.

Thermal oxidation of amorphous and polycrystalline silicon-containing materials also has been extensively used in IC manufacturing. Such applications include the poly buffered LOCOS, the gate sidewall isolator/spacer, the gate insulator for TFT, and other applications.

The low temperature oxidation of amorphous and polycrystalline silicon-containing materials is also known in the art. The following patents are related to low temperature oxidation.

U.S. Pat. No. 5,412,246 to Dobuzinsky et al. describes a plasma assisted oxidation of silicon and silicon nitride performed at a low plasma power. Dobuzinsky et al. teach that a high power plasma oxidation may cause damage to the grown oxide film. Therefore, a low plasma power process was selected to produce high-quality oxide films. Dobuzinsky et al. also disclose useful embodiments such as a low-temperature method of forming an oxide spacer on a doped gate. However, Dobuzinsky et al. do not teach any method of forming a nanolaminate with ultra-thin layer of amorphous or polycrystalline silicon-containing semiconductor.

U.S. Pat. No. 5,443,863 to Neely et al. describes a low temperature plasma assisted oxidation process. The plasma is created up stream of the processing zone with a microwave plasma electrical discharge. Neely et al. teach that such oxidation process can be conducted at a temperature below 300° C. Neely et al. describe a useful embodiment where a silicon carbide film is oxidized at a low temperature. However, Neely et al. do not teach any method of forming a nanolaminate with ultra-thin layer of amorphous or polycrystalline silicon-containing semiconductor.

U.S. Pat. No. 5,738,909 to Thakur et al. describes a method of forming thin oxides on a semiconductor substrate. Thakur et al. teach a method where a portion of the oxidation process is conducted in an ozone ambient in order to increase the oxide growth rate. In addition, Thakur et al. teach that an ultraviolet radiation can speed up the oxidation process even further. However, Thakur et al. do not teach any method of forming a nanolaminate with ultra-thin layer of amorphous or polycrystalline silicon-containing semiconductor.

U.S. Pat. No. 5,700,699 to Han et al. describes a method of forming gate oxide for thin film transistor (TFT). The gate oxide is formed with plasma assisted oxidation. The plasma is created with the aid of electron cyclotron resonance (ECE) electrical discharge. The preferred range of the deposited polysilicon layer is from 2,000 to 4,000 Å. Clearly, this range is far from the ultra thin regime. Consequently, Han et al. do not teach any method of forming a nanolaminate with ultra-thin layer of amorphous or polycrystalline silicon-containing semiconductor.

U.S. Pat. No. 5,238,849 to Sato describes a method of fabricating bipolar transistor. Sato teaches a method of forming an oxide layer between the crystalline base and polycrystalline emitter. The layer is formed with oxygen ions resulting in a substoichiometric silicon oxide. Sato neither teaches about the oxidation of the polycrystalline film nor provides any method of forming a nanolaminate with ultra-thin layer of amorphous or polycrystalline silicon-containing semiconductor.

Clearly, there remains a need in the art for a method of forming uniform ultra thin layers of amorphous and polycrystalline silicon and related layered structures. The present invention disclosure is directed toward a method for fabricating such nanolaminates.

SUMMARY OF THE INVENTION

One objective of this invention is to provide a method of creating a nanolaminate with thin and uniform layer of amorphous or polycrysaline silicon.

Another objective of this invention is to provide a method of forming a hard mask containing a nanolaminate with thin and uniform layer of amorphous or polycrystalline silicon.

These and other objects of this invention are accomplished by use of the methods of the present invention. In one aspect, a method for forming a nanolaminate of a silicon-containing material and an oxide on a substrate is disclosed herein. The method comprises the steps of: depositing a film containing an amorphous silicon-containing material onto the substrate, the film having an initial thickness; oxidizing the amorphous silicon-containing film by exposing the substrate to a gaseous mixture comprising atomic oxygen and molecular oxygen, wherein the ratio of atomic oxygen to molecular oxygen is about 0.00001 to 100, thereby forming a layer of oxide on the film, wherein after oxidation the film has a final thickness less than the initial thickness; and removing the oxide using, for example, a selective wet chemistry stripping process.

In another aspect, a method for forming a patterned hard mask on a substrate is disclosed, the patterned hard mask including a nanolaminate of a silicon-containing material and an oxide. The method comprises the steps of: depositing a film containing an amorphous silicon-containing material onto the substrate, the film having an initial thickness; oxidizing the amorphous silicon-containing film by exposing the substrate to a gaseous mixture comprising atomic oxygen and molecular oxygen, wherein the ratio of atomic oxygen to molecular oxygen is about 0.00001 to 100, thereby forming a layer of oxide on the film, wherein after oxidation the film has a final thickness less than the initial thickness; and patterning the layer of oxide using a lithography process, thereby exposing preselected areas of the amorphous silicon-containing film.

In yet another aspect of the present invention, a semiconductor structure is disclosed. The structure comprises a substrate; and a silicon-containing film on the substrate, the silicon-containing film having a thickness of less than about 100 Å, preferably less than about 80 Å, more preferably about 50 Å, and preferably with a uniformity of better than about 3 Å at 1 sigma standard deviation. The silicon-containing film may be either amorphous or polycrystalline. The semiconductor structure may further comprise a patterned thermal oxide film on the silicon-containing film, the patterned thermal oxide film having a thickness of at least about 50 Å. The structure may further comprise an insulating layer on the silicon-containing film; and an electrode layer on the insulating layer, the electrode having an electrical bias with respect to the silicon-containing film such that an electrical field is created across the insulating layer.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Figure 1A:
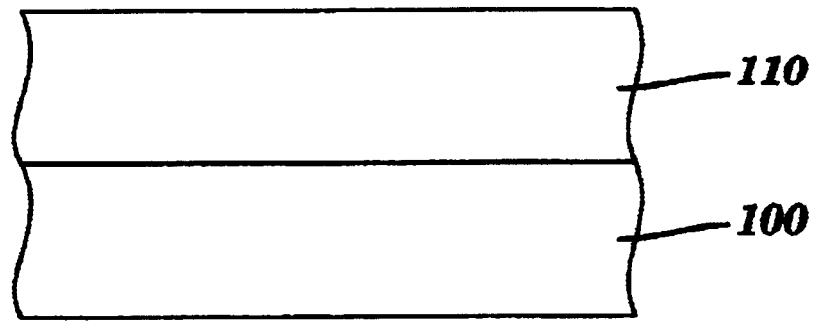
FIGS. 1(a)–1(b) illustrate a prior art method of forming a silicon/oxide nanolaminate.
Figure 1B:
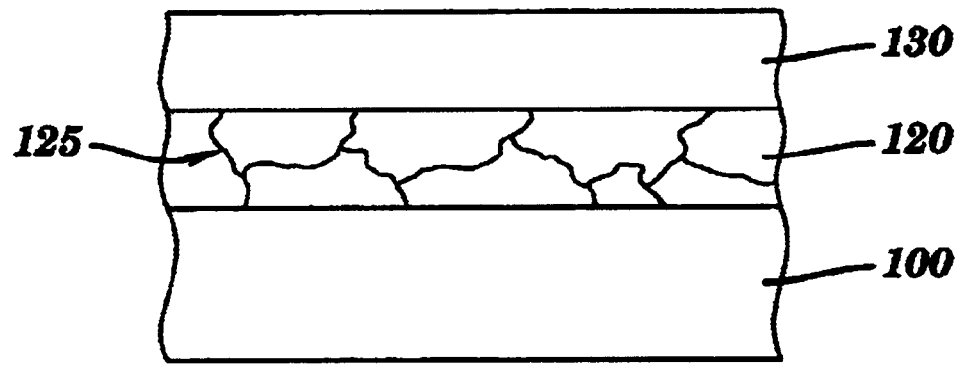

FIGS. 1(a)–1(b) demonstrate a challenge of creating a uniform silicon/oxide nanolaminate. In FIG. 1(a), a relatively thin layer of amorphous silicon 110 is deposited onto a substrate 100, such as a silicon or SOI substrate. In FIG. 1(b), the structure of FIG. 1(a) has undergone a thermal oxidation, causing a thermal oxide layer 130 to be grown and transforming the a-Si layer 110 into a polycrystalline silicon layer 120 having grain boundaries 125.

Even though a relatively thin layer of amorphous silicon 110 can be deposited onto a substrate 100, the high-temperature thermal oxidation of amorphous silicon causes its crystallization during temperature ramp-up. For silicon, a typical crystallization temperature range is about 520 to 600° C. The crystallization process may cause the thin amorphous silicon 110 to build-up causing a large thickness variation in the polysilicon layer 120. Furthermore, since the polysilicon grains 125 are formed at the early stages of oxidation, the oxygen may freely move deep into the grain boundaries. Therefore, it is a challenge to form a thin and uniform silicon/oxide nanolaminate.

Figure 2A:
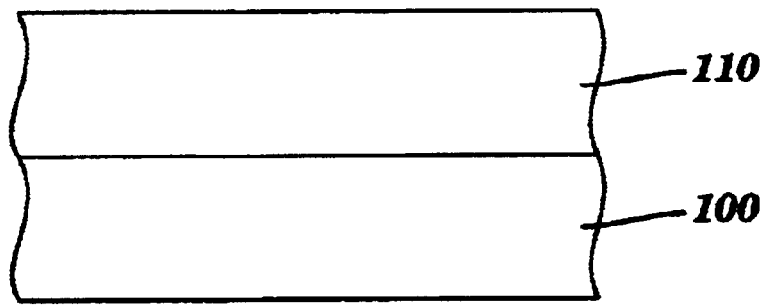
FIGS. 2(a)–2(b) illustrate the formation of a surface oxide on an amorphous silicon layer.
Figure 2B:
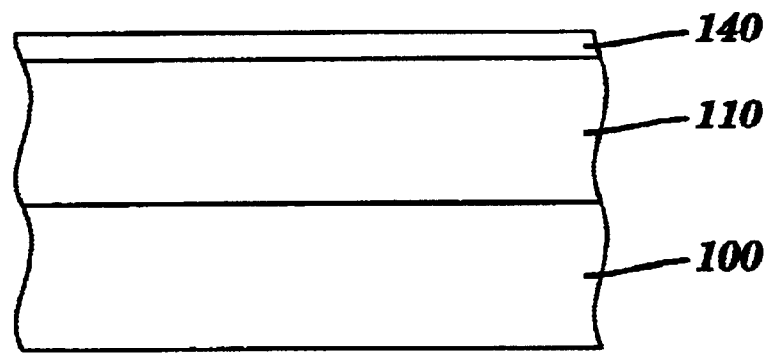

FIGS. 2(a)–2(b) illustrate that any amorphous silicon layer has a thin layer of surface oxide. In FIG. 2(a), a relatively thin layer of amorphous silicon 110 is deposited onto a substrate 100, such as a silicon or SOI substrate. Exposure of amorphous silicon film 110 to moisture at low temperature may produce a very thin film of native oxide 140. The surface (native) oxide 140 is limited in thickness to about 20 Å. In addition, the uniformity of the surface oxide 140 is generally much worse than that of thermal oxide.

In accordance with one embodiment of the present invention, the method of fabricating a substantially uniform nanolaminate includes a step of depositing a relatively thick uniform amorphous silicon film (thickness about 100 to 200 Å, preferably about 150 Å), oxidizing a substantial portion of the amorphous film by employing atomic oxygen, stripping the oxide in a highly selective etch, and forming a film on top of the amorphous silicon. FIGS. 3(a)–3(d) illustrate this method.

Figure 3A:
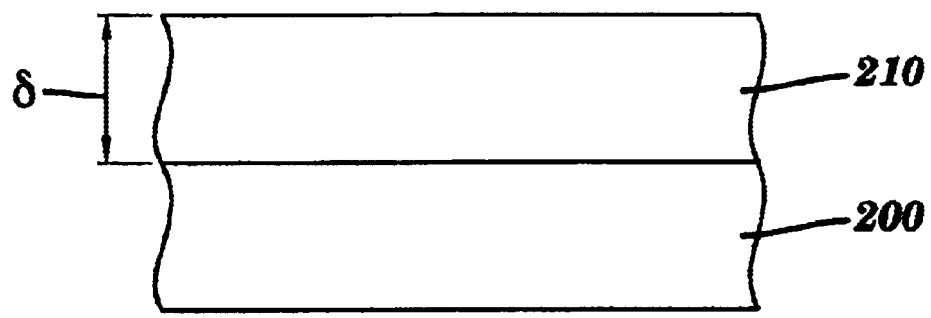
FIGS. 3(a)–3(d) illustrate one embodiment of the method of the present invention in which a uniform polycrystalline nanolaminate is formed.
Figure 3B:
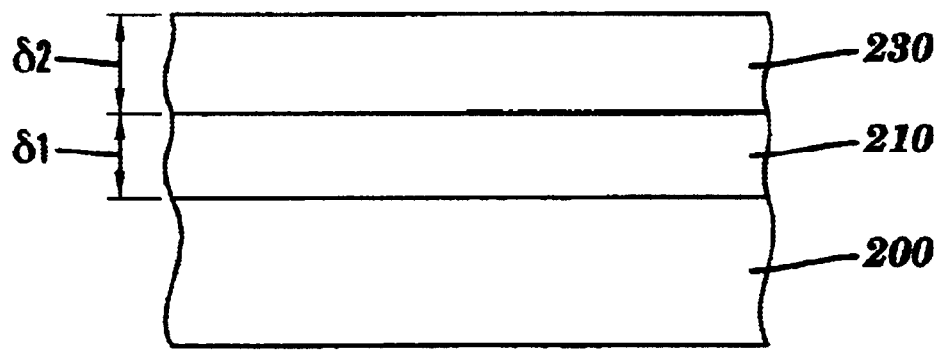

FIG. 3(a) shows a relatively thin layer of amorphous silicon 210 deposited onto a substrate 200, such as a silicon or SOI substrate. Alternatively, layer 210 may comprise a silicon-containing material such as SiGe or SiGeC. Amorphous silicon layer 210 has an initial thickness $\partial$. In FIG. 3(b), the structure of FIG. 3(a) has been subjected to atomic oxidation to produce a thick thermal oxide 230 having thickness $\partial 1$ and a thinned-down amorphous silicon layer 210 having final thickness $\partial 2$, where $\partial 2 < \partial$, and $\partial 1 + \partial 2 > \partial$.

For example, in order to produce an amorphous silicon film having a final thickness of 50 Å, an amorphous silicon film having an initial thickness of 150 Å was oxidized in atomic oxygen to form 200 Å of silicon oxide. A typical uniformity of deposited 150 Å amorphous silicon film is 3 Å at 1 sigma standard deviation, while the uniformity parameter for the 200 Å oxide film is about 1 Å at 1 sigma standard deviation. The resultant uniformity parameter of the 50 Å amorphous silicon layer is only 3.16 Å at 1 sigma standard deviation.

Amorphous silicon layer 210 may be oxidized by exposing the layer to an atomic oxygen-containing mixture, preferably at a temperature below the crystallization temperature of amorphous silicon (i.e., below about 520° C.). The atomic oxygen-containing mixture is preferably generated in a chemical, photochemical or remote plasma process such that gates are not directly exposed to the plasma. For example, one can produce atomic oxygen in a plasma discharge. Efficient plasma discharges operate at a low pressure, typically 1–200 mTorr with a relatively high fraction of dissociation of the order of 10%. In fact, one can easily dissociate almost all molecular oxygen in an optimized low pressure discharge.

Therefore, the fraction of dissociation can vary over many orders of magnitude from 0.0001 to 100 percent. The fraction of dissociation, a, is defined as the number of dissociated oxygen molecules or half of oxygen atoms to the original number of oxygen molecules or the resultant number of oxygen molecules plus half of oxygen atoms:

$$\alpha = \frac{[O]}{2[O_2] + [O]}$$

The atomic oxygen to molecular oxygen ratio is related to the fraction of dissociation as follows:

$$\frac{[O]}{[O_2]} = \frac{2\alpha}{1 - \alpha}$$

When alpha is small the atomic oxygen to molecular oxygen ratio is simply $2\alpha$. When the fraction of dissociation approaches 1 or 100% the atomic oxygen to molecular oxygen ratio approaches infinity.

In practice, it is extremely hard to achieve a fraction of dissociation above 98%, therefore one can put a limit of 100 on the ratio of atomic oxygen to molecular oxygen. Furthermore, there is no particular technical need of achieving such fraction of dissociation. In fact, a fraction of dissociation of 0.8 can be considered very high as compared to the typical range of 0.1–0.4 observed in high-electron-density discharges. Therefore, the preferred range for the ratio of atomic oxygen to molecular oxygen is about 0.00001 to 10.

There are many ways to measure the concentration of atomic oxygen. One indicator of atomic oxygen concentration is the speed of a chemical reaction (the oxide growth rate). The high chemical potential of atomic oxygen (~2 eV) can speed up the chemical reaction at a desired temperature range of 300–1500K by as much as 30 orders of magnitude. One can also use optical spectroscopy of plasma to determine ppm and ppb level of various species in the plasma.

The atomic oxygen content in the mixture can be specified in terms of (a) impinging flux (j) of atomic oxygen onto the substrate; or (b) partial pressure (p) of atomic oxygen in the close proximity of the substrate; or (c) concentration of atomic oxygen (n) in the close proximity of the substrate. Parameters (b) and (c) are related through the perfect gas (Boltzmann) relationship:

p=nkT where T is the gas temperature, and k is the Boltzmann constant. They can be used as a measure of atomic oxygen content when the oxygen atom mean free pass is much smaller than the characteristic chamber dimension. In addition, the parameter (a) is related to (c) through the well-known relationship:

$$j = \frac{nv}{4}$$

where v is the average speed of oxygen atom. In molecular beam chambers, the mean free pass is larger than the characteristic chamber dimension. In these chambers, the atomic oxygen is delivered in forms of atomic/molecular beams where the concept of pressure is not adequate. In this case, the parameter (a) can be used to describe the atomic oxygen content. It has been found that the exposure of a silicon-containing layer to atomic oxygen at a pressure of about 0.5 to 2 mTorr and at a temperature of about 400 to 450° C. results in a differential oxide growth rate of approximately 0.5 to 1 Å/sec.

Figure 3C:
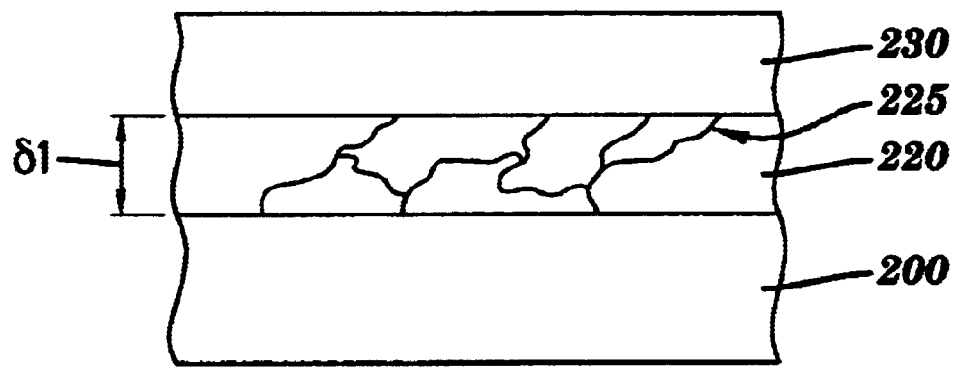

In FIG. 3(c), a method of forming a thin polycrystalline silicon layer and associated nanolaminate is shown. The structure of FIG. 3(b) undergoes a crystalline anneal resulting in a thin polycrystalline layer 220 having grain boundaries 225. The polycrystalline layer 220 is sliced in between rigid layers, i.e., substrate 200 and thermal oxide 230. Because of the presence of encapsulating rigid layers, the polysilicon cannot build-up. The size of the polycrystalline grains are directly proportional to the temperature and the duration of the anneal. Higher temperature and longer anneal time result in larger grains. Large grains are useful for building fast transistors with reduced grain-boundary scattering or leakage effects. The temperature and duration of the crystallization anneal can be varied from about 600° C. to about 1050° C. and from about 1 second to about 4 hours, respectively.

Figure 3D:
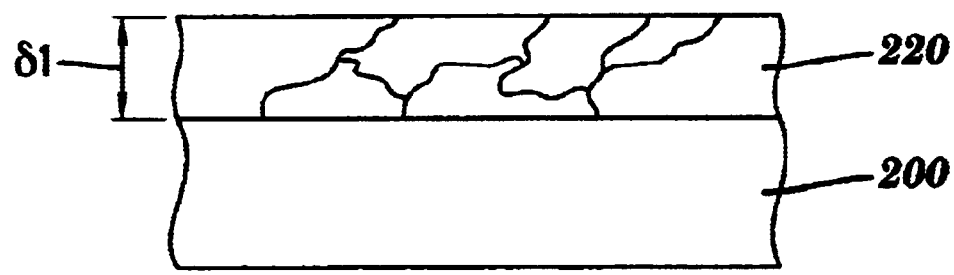

In FIG. 3(d), thick thermal oxide layer 230 has been removed, leaving thin polycrystalline silicon layer 220 and associated nanolaminate. A highly selective HF-based wet strip may be used to remove thermal oxide layer 230. While this strip is optional, it is preferable to include the strip to create a structure other than silicon/oxide nanolaminate. The strip is typically followed with a low temperature deposition of a material. This top material may be a thin layer of silicon oxynitride ($SiO_xN_y$), silicon nitride ($Si_3N_4$), silicon-rich silicon nitride ($SiN_x$, where x<0.75), and/or metal-based oxide (e.g., $HfO_2$, $ZrO_2$, $Al_2O_3$) and their close derivative compounds such as oxynitrides and silicates.

Figure 4A:
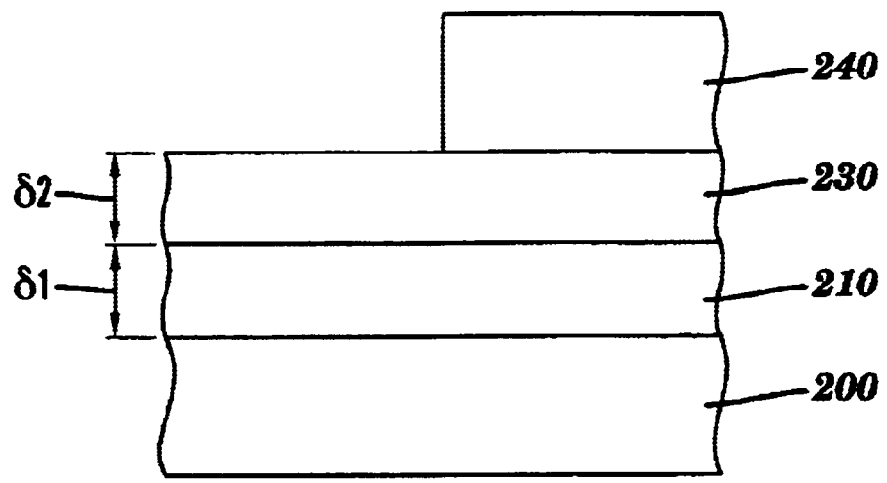
FIGS. 4(a)–4(b) illustrate another embodiment of the method of the present invention in which a hard mask is formed.
Figure 4B:
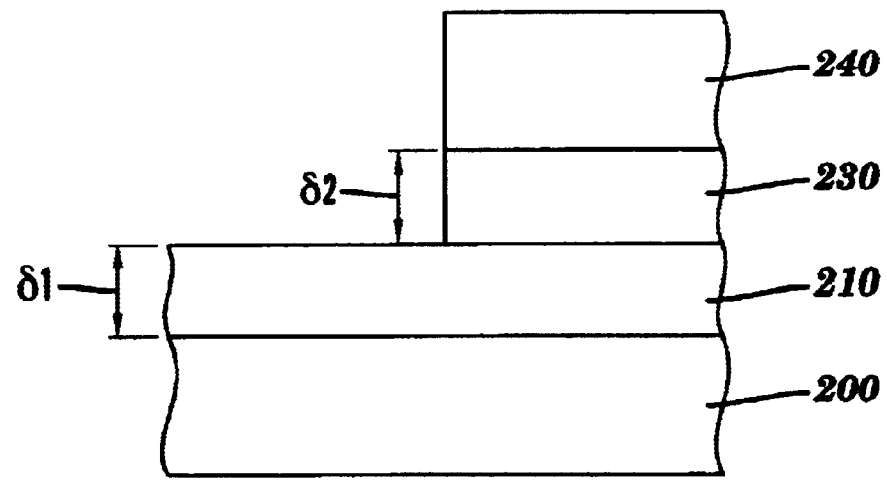

FIGS. 4(a)–4(b) illustrate a process of creating a hard mask. In FIG. 4(a), the structure of FIG. 3(b) is patterned using standard lithography techniques. For example, a photoresist layer 240 is deposited on thermal oxide layer 230, and photoresist layer 240 is patterned. In FIG. 4(b), preselected exposed areas of thermal oxide 230 are etched stopping on amorphous silicon layer 210. After the oxide etch, resist 240 is typically stripped. The resultant amorphous silicon/oxide hardmask structure can be used to protect or select other materials of the substrate. An important advantage of the silicon/silicon oxide hardmask is that is can be made very thin.

Figure 5A:
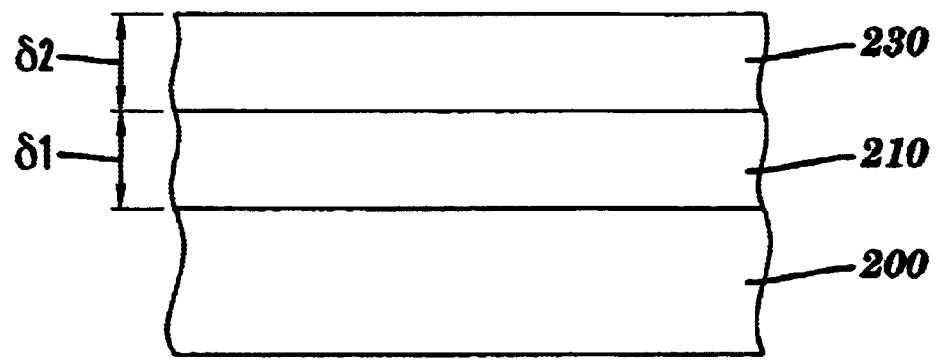
FIGS. 5(a)–5(b) illustrate yet another embodiment of the method of the present invention in which a uniform amorphous nanolaminate is formed.
Figure 5B:
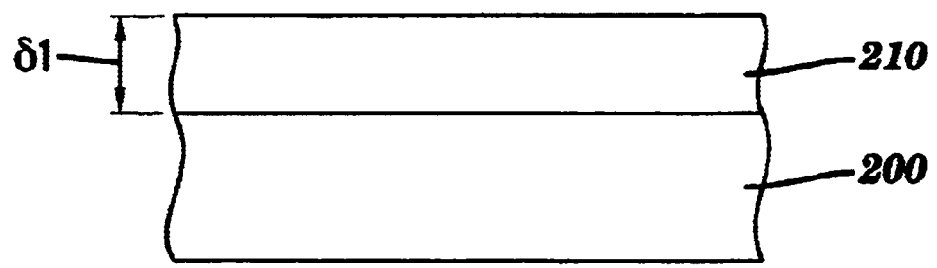

In another embodiment shown in FIGS. 5(a)–5(b), the crystallization anneal shown in FIG. 3(c) is omitted, resulting in a uniform thin amorphous layer.

Specifically, FIG. 5(a) shows the structure of FIG. 3(b) which includes thick thermal oxide 230 having thickness $\partial 1$ and thinned-down amorphous silicon layer 210 having thickness $\partial 2$, where $\partial 2 < \partial$, and $\partial 1 + \partial 2 > \partial$. In FIG. 5(b), thick thermal oxide layer 230 has been stripped away using the same methods as may be used in the stripping step illustrated in FIG. 3(d), leaving thin amorphous silicon layer 210 and associated nanolaminate.

Thin silicon nanolaminates are particularly useful when they exhibit substantial quantum effects, that is, the thin silicon layers 210 or 220 produce a quantum well with substantial separation of discrete quantum levels. Since most of useful electrical and optical devices operate at or around room temperature (about 275 K to 350 K), the quantum levels should be separated by more than the characteristic energy, kT, associated with this temperature range. The separation of quantum levels is related to the quantum well width (thickness of layers 210 or 220) via a well-known relation:

$$E_n = \frac{h^2 n^2}{8m^* L^2}$$

where $E_n$ is the nth energy level, h is the Planck constant, $m^*$ is the effective electron/hole mass, and L is the quantum well width in the case of an infinitely deep quantum well, or the effective quantum well width in the case of a finite-depth quantum well. For a typical quantum well of about 1 eV and typical electron masses in conduction band of silicon of 0.2 $m_0$ and 0.92 $m_0$, where $m_0$ is the mass of free electrons, L is close to the thickness of layer 210 or 220. By letting n=1, $m^* = 0.2\ m_0$, and $E_1 > kT = 0.03$ eV, one may achieve a useful range of quantum well width of L<80 Å. With the method of this invention, such amorphous or polycrystalline silicon layers may be fabricated.

Quantum well based devices are sensitive to the variation of quantum well width because the varying width results in a shift of quantum well energy levels and, consequently, unpredictable device characteristics. Acceptable variation of quantum levels, $\Delta E_n$, for practical optical and electron quantum well based devices is of the order of thermal energy, kT. This defines an allowed variation $\Delta L$ for the thickness of layer 210 or 220 as follows:

$$\frac{\Delta L}{L} < \frac{\Delta E_n}{2E_n}$$

For the lowest energy level (n=1, $m^* = 0.92\ m_0$) and a $\Delta L$ of 10 Å (achievable with the method of this invention), the condition of $\Delta E_1 < 0.03$ eV puts a restriction on L of L>30 Å.

One useful and novel device based on the quantum well nanolaminate is the silicon-based photodetector that efficiently absorbs light at an energy below that of the silicon bandgap. In general, optical processes such as light absorption and emission are not very efficient in silicon-based crystals due to their indirect bandgap. For this reason, most optical devices are made from III–V compound semiconductors with direct bandgap. Intersubband optical transitions, that is, transitions that happen within either conduction or valence bands, do not depend on the type of bandgap and can be employed for the fabrication of optical devices from indirect bandgap semiconductors. A typical intersubband optical device uses quantum wells to increase efficiency of light processes. Furthermore, the light wavelength or energy of intersubband processes can be adjusted by shifting the energy levels within the quantum well by changing the quantum well width, for example. Intersubband optical devices can operate at a light energy that is lower than the bandgap of active material. Subsequently, intersubband optical transitions circumvent two major problems of silicon-based optical devices: (1) presence of indirect bandgap, and (2) restriction to the energy (wavelength) of emitted and/or absorbed light. For pure silicon, this wavelength restriction prohibits any practical optical devices operating at a wavelength of longer than about 1 μm, while for pure germanium the operating range is limited to the wavelength below about 1.5 μm. Because 1.3 μm and 1.55 μm light is widely used for long distance optical data transmission via optical fibers, there is a continuous need for silicon-based optical devices that can operate in the wavelength range. Further teaching on silicon-based optical devices and, more specifically, on intersubband heteroepitaxial silicon germanium (SiGe) photodetectors is provided in: Horst Zimmerman, *Integrated Silicon Optoelectronics* (Springer-Verlag, 2000), pp. 145–159.

In contrast to the well known heteroepitaxial quantum well structure, the structure of this invention employs an ultra-thin, uniform amorphous or polycrystalline nanolaminate. Because of its amorphous nature, the nanolaminate can be prepared on any substrate. For example, the substrate 200 may include an integrated circuit with multiple layers of interconnects.

Figure 6:
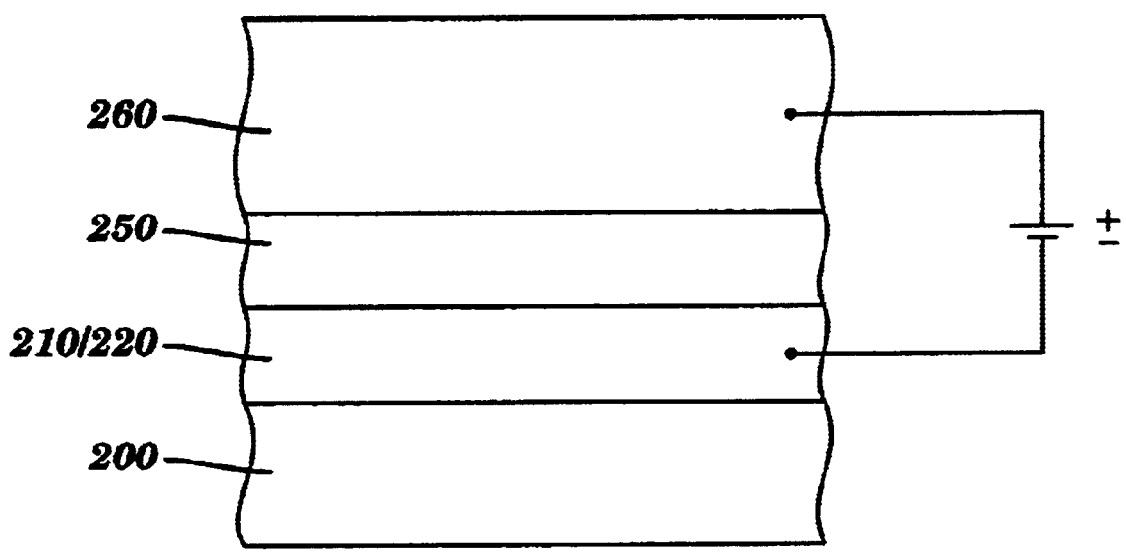
FIG. 6 illustrates a novel photodetector structure based on and incorporating the nanolaminate of the present invention.

FIG. 6 shows a novel photodetector structure based on and incorporating the nanolaminate of this invention. The photodetector structure comprises substrate 200, absorbing conductive quantum well 210/220, a thin insulating layer 250, and electrode layer 260. The absorbing conductive quantum well 210/220 may be either amorphous (210) or polycrystalline (220). In operation, the electrode layer 260 is biased to some potential with respect to the conductive layer 210/220, creating an electrical field across insulating layer 250. In the absence of light, the dark current between layers 210/220 and 260 is due to the tunneling and/or thermal emission of charged carriers (typically electrons) through the insulating layer 250. The dark current is relatively small due to a large conduction band discontinuity between layers 250 and 210/220 as compared to the thermal energy, kT. In the presence of light, the carriers are excited from the lower quantum level within layer 210/220 either to above the conduction band edge of insulating layer 250 or to an upper quantum level which is close to the conduction band edge of insulating layer 250. The excited carriers are then swept away by the electric field of insulating layer 250, resulting in a photo-generated current between layers 210/220 and 260.

The substrate 200 has an insulating surface (typically silicon oxide) beneath the absorbing layer of the photodetector. The silicon-based (e.g., Si, SiGe or SiGeC) absorbing layer 210/220 is produced with the method of this invention. The thickness of layer 210/220 may be from about 30 Å to about 80 Å to create a well-defined quantum level within the layer. The layer 210/220 may be made conductive by, for example, doping during the deposition process. The n-type doping with either P or As of $1\times10^{18}$ to $1\times10^{21}$ cm$^{-3}$ in volume concentration is preferred. Alternatively, the electrical conduction of layer 210/220 may be achieved by creating an inversion charge with substantial electrical bias of electrode 260. Positive bias of electrode 260 is preferred. In the case of n-type doping of layer 210/220, the voltage across the insulating layer 250 may be relatively small (e.g., about 1 V or less). In this case, the device operates in accumulation. The insulating layer 250 is selected such that the conduction band discontinuity with respect to the layer 210/220 is roughly equal to the energy of absorbed light. This requirement may pose a challenge for longer wavelength devices, because typical insulating materials such as silicon nitride ($Si_3N_4$) and silicon dioxide ($SiO_2$) have a large conduction band discontinuity with silicon (typically 2 to 3 eV). Nevertheless, there are insulating materials with smaller conduction band discontinuity with silicon. They include silicon-rich silicon nitride and certain transitional metal oxides such as hafnium, zirconium, tungsten, tantalum oxides, and their close compounds silicates and oxynitrides. The preferred thickness of the insulating layer 250 is from about 10 Å to about 100 Å.

For clarity, the electrical contacts to layers 210/220 and 260, isolation structures between the electrode 260 and the contacts to layers 210/220, and the light coupling structures are not shown in FIG. 6. Nevertheless, these structures are meant to be present in the final photodetector structure. The preferred propagation direction of the coupled light is parallel to the quantum well, in the (x,y) plane. The preferred length of the photodetector is from about 1 $\mu$m to about 100 $\mu$m. The preferred width of the photodetector is from about 10 $\mu$m to about 0.1 $\mu$m. The contacts to the layer 210/220 may be located along the longer sides of the electrode 260 to minimize the distance between the contacts on the opposite sides of the electrode. The narrower the electrode 260, the shorter the distance between the contacts, and the faster the detector. The output current of the photodetector is typically coupled to an amplifier and a detection circuit.

The basic photodetector structure shown in FIG. 6 may also be used for light generation. In this embodiment, a negative bias is applied to electrode 260 to align its Fermi level with an upper quantum level of layer 210/220. The electrons from electrode 260 are efficiently coupled by tunneling through layer 250 into the upper quantum level and then relax into a lower quantum level by emitting a photon. Since the number of emitted photons is proportional to the tunneling current through layer 250, the layer should be substantially thin to allow for efficient tunneling. In the case of a light emitting device, the preferred thickness of insulating layer 250 is from about 6 Å to about 25 Å. A portion of charge carriers (electrons) in the layer 210/220 may also tunnel into the substrate 200. The tunneling efficiency into substrate 200 depends on the thickness of the insulating layer on the surface of substrate 200 and the number of available empty electronic states beneath that insulating layer. One may preferentially maximize the tunneling current into the substrate 200 for the electrons located at lower quantum well levels of layer 210/220. This may be accomplished by preferentially increasing the number of available electronic states in the substrate at the energy close to that of the lower quantum well level of layer 210/220 and by thinning down the substrate surface insulating film to below about 20 Å, and preferably to about 8–10 Å. One possible structure that may provide such substrate property coupled with the optical device structure on top of it is two nanolaminates stacked on top of each other. In this embodiment, the lower nanolaminate becomes a portion of substrate 200. The thickness and material of its layer 210/220 is selected to provide an empty resonant quantum level to the lower quantum level of the device nanolaminate on top of it. The resonant level of the substrate nanolaminate is positioned at the same energy as the lower quantum level of the device nanolaminate when biased for operation. Since the upper quantum level of device nanolaminate does not have a resonant level, the preferential tunneling for electrons from the lower quantum level may be achieved. Efficient removal of electrons from the lower quantum level of the light emitting layer creates an optical gain and associated stimulated emission. When coupled with low loss optical feedback, it results into a laser.

The nanolaminate-based photodetectors, light emitters, and conventional optical waveguides can be combined into the on-chip optical network. The construction of such optical network is mainly decoupled from the material and fabrication process of underlying substrate 200.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method for forming a nanolaminate of a silicon-containing material and an oxide on a substrate, the method comprising the steps of:

depositing a film containing amorphous silicon onto the substrate, the film having an initial thickness;

oxidizing the amorphous silicon-containing film by exposing the substrate to a gaseous mixture comprising atomic oxygen and molecular oxygen, wherein the ratio of atomic oxygen to molecular oxygen is about 0.00001 to 100, thereby forming a layer of oxide on the film, wherein after oxidation the film has a final thickness less than the initial thickness; and removing the oxide.

2. The method of claim 1, wherein the initial thickness of the film is about 100 to 200 Å.

3. The method of claim 1, wherein the final thickness of the film is less than 100 Å.

4. The method of claim 1, wherein the initial thickness of the film is about 150 Å and the final thickness of the film is about 50 Å.

5. The method of claim 1 further comprising, after oxidation of the amorphous silicon-containing film, the step of annealing the amorphous silicon-containing film to form a film containing polycrystalline silicon.

6. The method of claim 1, wherein the oxide is removed using a selective wet chemistry stripping process.

7. The method of claim 6, wherein the oxide is removed using hydrofluoric acid (HF).

8. A method for forming a patterned hard mask on a substrate, the patterned hard mask including a nanolaminate of a silicon-containing material and an oxide, the method comprising the steps of:

depositing a film containing amorphous silicon onto the substrate, the film having an initial thickness;

oxidizing the amorphous silicon-containing film by exsposing the substrate to a gaseous mixture comprising atomic oxygen and molecular oxygen, wherein the ratio of atomic oxygen to molecular oxygen is about 0.00001 to 100, thereby forming a layer of oxide on the film, wherein after oxidation the film has a final thickness less than the initial thickness; and patterning the layer of oxide using a lithography process, thereby exposing preselected areas of the amorphous silicon-containing film.

* * * * *

UNITED STATES PATENT AND TRADEMARK OFFICE
CERTIFICATE OF CORRECTION

PATENT NO.    : 6,764,883 B1
DATED         : July 20, 2004
INVENTOR(S)   : Dokumaci et al.

It is certified that error appears in the above-identified patent and that said Letters Patent is hereby corrected as shown below:

<u>Title page,</u>
Item [75], Inventors, the name of the third inventor should be corrected to read:
-- Michael Belyansky --

Signed and Sealed this

Thirtieth Day of November, 2004

JON W. DUDAS
*Director of the United States Patent and Trademark Office*